(12) United States Patent
Jones (10) Patent No.: US 7,228,031 B2
(45) Date of Patent: Jun. 5, 2007

(54) METHOD AND APPARATUS PROVIDING AN OUTPUT COUPLER FOR AN OPTICAL BEAM

(75) Inventor: Richard Jones, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/432,611

(22) Filed: May 10, 2006

(65) Prior Publication Data

US 2006/0203864 A1    Sep. 14, 2006

Related U.S. Application Data

(62) Division of application No. 10/811,521, filed on Mar. 29, 2004.

(51) Int. Cl.
  *G02B 6/02*  (2006.01)
  *G02B 6/12*  (2006.01)
  *B21C 37/12* (2006.01)

(52) U.S. Cl. ............................ 385/30; 385/14; 385/18; 72/50

(58) Field of Classification Search ................. 385/30, 385/18, 14; 72/50.1
See application file for complete search history.

(56) References Cited

U.S. PATENT DOCUMENTS 4,852,960 A    8/1989   Alferness et al.
5,513,196 A *  4/1996   Bischel et al. ............... 372/22
6,522,794 B1 * 2/2003   Bischel et al. ............... 385/4

(Continued)

FOREIGN PATENT DOCUMENTS

WO     WO 99/09440        2/1999
WO     WO 2004/015466 A2  2/2004

(Continued)

OTHER PUBLICATIONS

Haus, H. A. et al., "Narrow-Band Optical Channel-Dropping Filter," *IEEE Journal of Lightwave Technology*, vol. 10, No. 1, (Jan. 1992), pp. 57-62.

(Continued)

*Primary Examiner*—Kaveh Kianni
(74) *Attorney, Agent, or Firm*—Blakely, Sokoloff, Taylor & Zafman LLP (57) ABSTRACT

An optical output coupler having a reflector integrated in an evanescent coupler. In one aspect of the present invention, an apparatus according to an embodiment of the present invention includes first and second optical paths. An optical beam is to be directed through the first optical path. The apparatus also includes an evanescent coupler, which evanescently couples the first and second optical paths. The apparatus further includes a reflector, which is included in the evanescent coupler and integrated in the first and second optical paths. The optical beam that is directed through the first optical path is reflected from the reflector as the optical beam is concurrently evanescently coupled from the first to the second optical path.

9 Claims, 6 Drawing Sheets

U.S. PATENT DOCUMENTS

| | | | |
|---|---|---|---|
| 6,813,405 B1* | 11/2004 | Bendett et al. | 385/14 |
| 2002/0126942 A1* | 9/2002 | Evans | 385/14 |
| 2003/0007733 A1* | 1/2003 | Levner et al. | 385/37 |
| 2003/0198259 A1 | 10/2003 | Zhang et al. | |
| 2004/0208579 A1* | 10/2004 | Bendett et al. | 398/84 |
| 2005/0286602 A1* | 12/2005 | Gunn et al. | 372/94 |

FOREIGN PATENT DOCUMENTS

| | | |
|---|---|---|
| WO | WO 2004/015466 A3 | 2/2004 |

OTHER PUBLICATIONS

Chuang, Z., et al., "Design of Widely Tunable Semiconductor Lasers Using Grating-Assisted Codirectional-Coupler Filters," *IEEE Journal of Quantum Electronics*, vol. 29, No. 4, (Apr. 1993), pp. 1071-1080.

PCT/US2005/009662, PCT Search Report and Written Opinion, Jun. 30, 2005.

* cited by examiner

METHOD AND APPARATUS PROVIDING AN OUTPUT COUPLER FOR AN OPTICAL BEAM

CROSS-REFERENCE TO RELATED APPLICATIONS

This application is a divisional of, and claims priority under 35 U.S.C. § 120 from, U.S. patent application Ser. No. 10/811,521, filed Mar. 29, 2004, and still pending.

BACKGROUND OF THE INVENTION

1. Field of the Invention

The present invention relates generally to optical devices and, more specifically, the present invention relates to output couplers.

2. Background Information

The need for fast and efficient optical-based technologies is increasing as Internet data traffic growth rate is overtaking voice traffic pushing the need for fiber optical communications. Transmission of multiple optical channels over the same fiber in the dense wavelength-division multiplexing (DWDM) system provides a simple way to use the unprecedented capacity (signal bandwidth) offered by fiber optics. Commonly used optical components in the system include lasers, WDM transmitters and receivers, optical filters such as diffraction gratings, thin-film filters, fiber Bragg gratings, arrayed-waveguide gratings and optical add/drop multiplexers.

Lasers are well known devices that emit light through stimulated emission and produce coherent light beams with a frequency spectrum ranging from infrared to ultraviolet and may be used in a vast array of applications. In optical communications or networking applications, semiconductor lasers may be used to produce light or optical beams on which data or other information may be encoded and transmitted.

BRIEF DESCRIPTION OF THE DRAWINGS

The present invention is illustrated by way of example and not limitation in the accompanying figures.

DETAILED DESCRIPTION

Methods and apparatuses for outputting an optical beam from an evanescent coupler are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
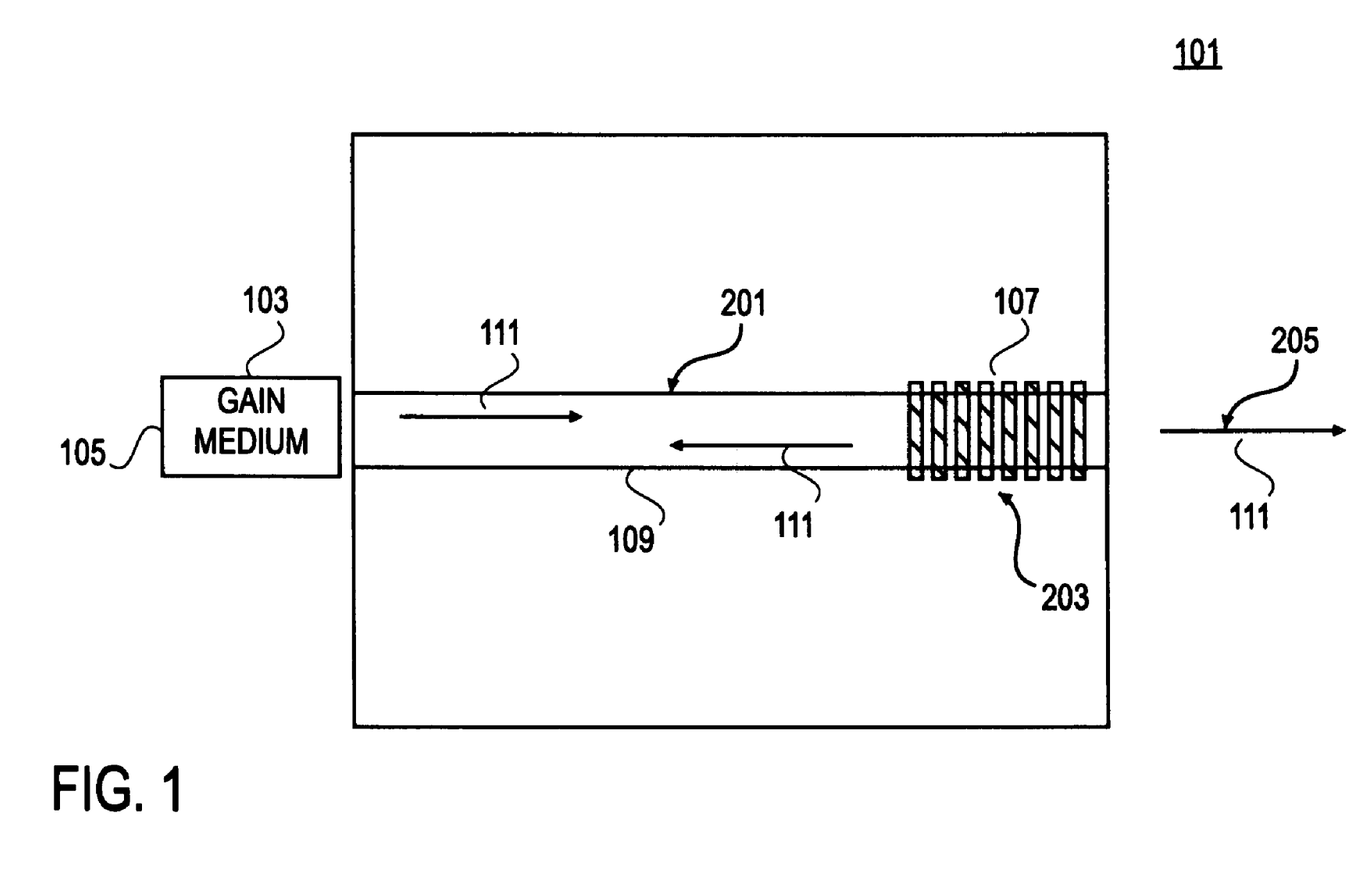
FIG. 1 is a block diagram illustrating a laser having an output in which an optical beam is transmitted through a Bragg grating.

FIG. 1 is an illustration of an external cavity (ECL) laser 101 that includes a gain medium 103 disposed between reflectors 105 and 107. A laser cavity 109 is defined between reflectors 105 and 107, which are located at the opposite ends of laser cavity 109. In operation, electricity is first converted into light in laser cavity 109 with gain medium 103. As can be appreciated to those skilled in the art, this light may be created in the laser cavity 109 by for example current injection in semiconductors (gain media) to create electron-hole pairs such that light is produced through electron-hole radiative recombination processes. This light is illustrated in FIG. 1 as optical beam 111 emanating from gain medium 103 in laser cavity 109. In the example shown in FIG. 1, reflector 105 is shown as a broad band cleaved or high reflection coated facet of gain medium 103 and reflector 107 is shown as a Bragg grating having a Bragg wavelength, which is the wavelength of at least a portion of optical beam 111 that is reflected. Thus, the reflected portion of optical beam 111 has a wavelength substantially equal to Bragg wavelength of reflector 107. Optical beam 111 continues to reflect back and forth between reflectors 105 and 107 such that lasing, or the amplification of stimulated emission of light, occurs in laser cavity 109. The output from laser 101 is taken from light transmitted through reflector 107 acting as an end mirror of laser cavity 109.

Figure 2A:
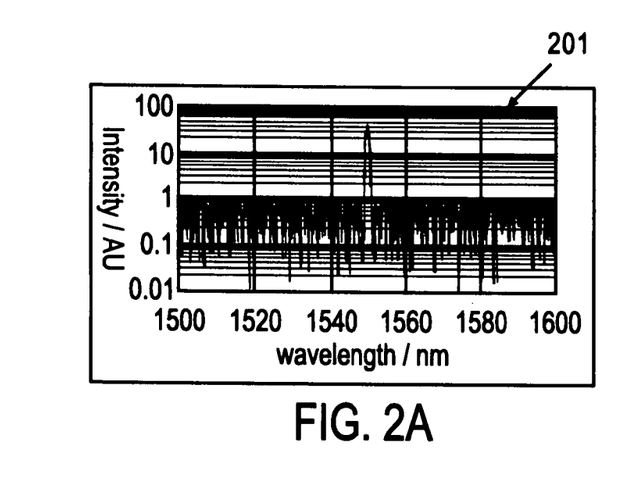
FIG. 2A is a diagram illustrating the intra-cavity spectrum of an optical beam within a laser cavity.
Figure 2B:
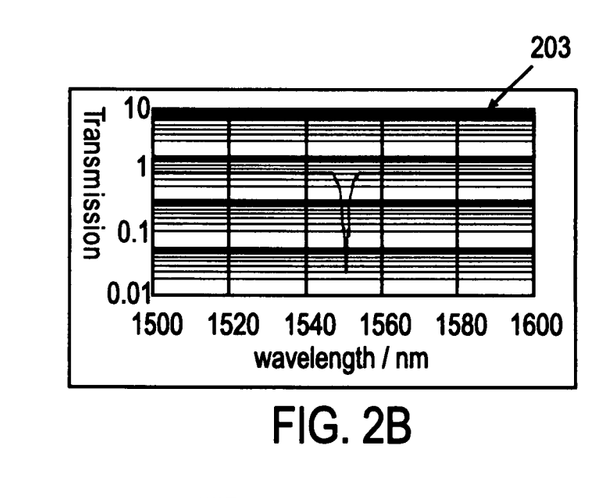
FIG. 2B is a diagram illustrating the transmission spectrum of a Bragg grating of a laser through which an optical beam is transmitted.
Figure 2C:
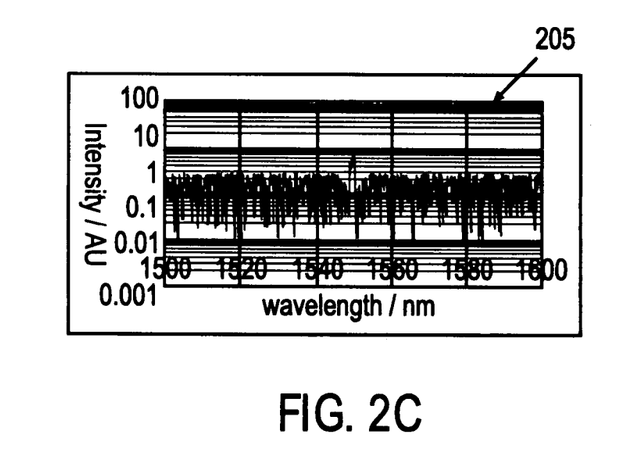
FIG. 2C is a diagram illustrating the resulting output spectrum of an optical beam transmitted through a Bragg grating of a laser.

The configuration of laser 101 in FIG. 1 has a disadvantage in that the intra-cavity spectrum is modified by the transmission function of the output reflector 107, which causes the side mode suppression ratio (SMSR) of the output to be reduced compared to that inside the cavity. To illustrate, FIG. 2A shows one example of the intra-cavity spectrum 201 of optical beam 111 within laser cavity 109, FIG. 2B shows one example of the transmission spectrum 203 of optical beam 111 through reflector 107 and FIG. 2C shows one example of the output spectrum of 205 optical beam 111 output from reflector 107 of laser 101. As shown in the example, FIG. 2A, lasing of optical beam 111 occurs at approximately 1550 nm and the example in FIG. 2B shows that the Bragg wavelength of reflector 107 is approximately 1550 nm. As summarized above, the intra-cavity spectrum 201 of optical beam 111 is modified by the transmission function of reflector 107 when optical beam 111 is output from laser 101 through reflector 107. As a consequence, this results in the reduction of the SMSR of optical beam 111 at 1550 nm because of the single pass of optical beam 111 through reflector 107, which is illustrated in output spectrum 205 of FIG. 2C.

Figure 3:
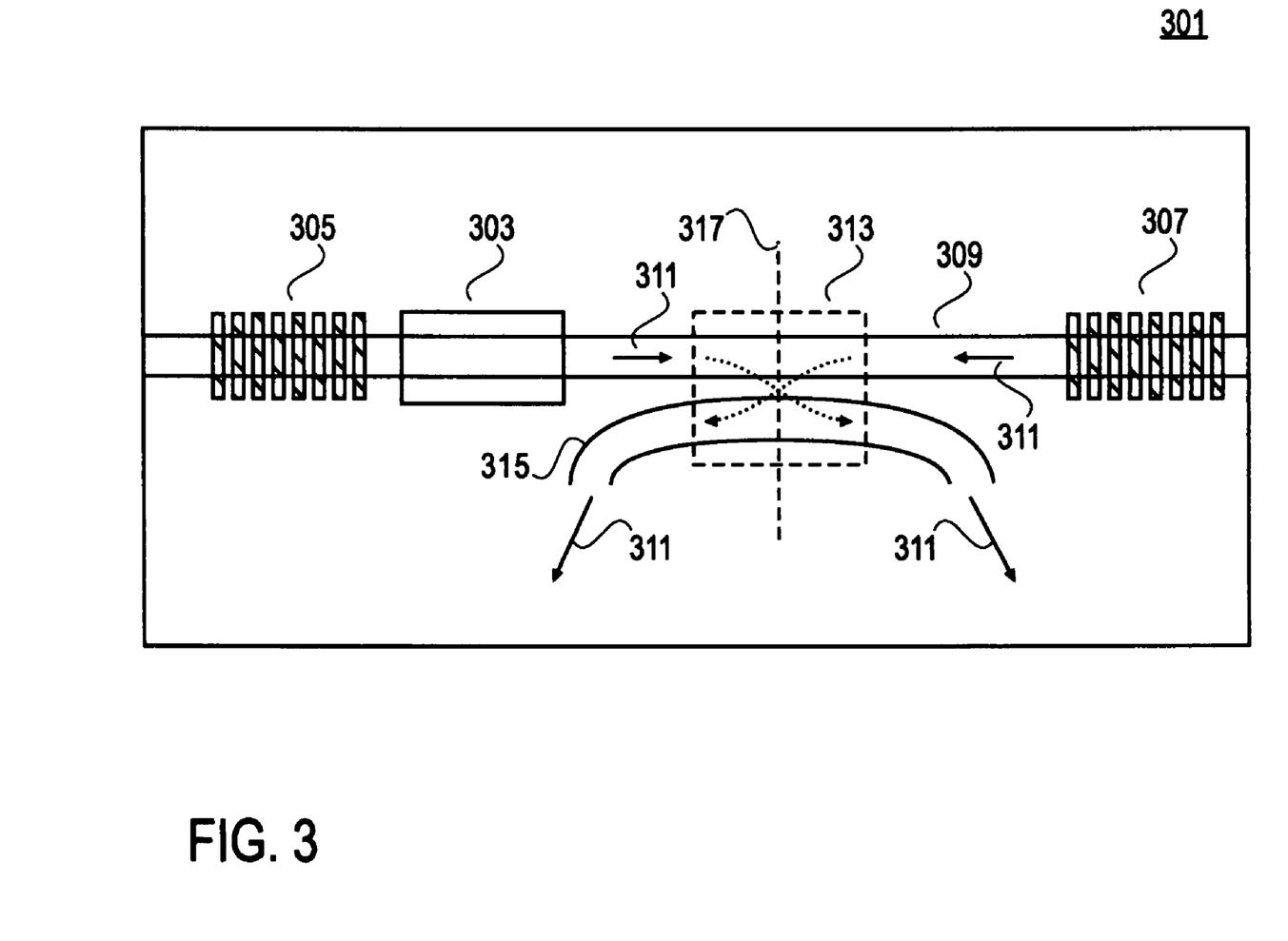
FIG. 3 is a block diagram illustrating a distributed feedback laser having an evanescent output coupler with two outputs from which an optical beam is output from the laser.

FIG. 3 is an illustration of another example of a DFB laser 301, which addresses the SMSR reduction issue discussed above in connection with laser 101. As shown in FIG. 3, laser 303 includes a gain medium 303 disposed between reflectors 305 and 307. A laser cavity 309 is defined between reflectors 305 and 307. Optical beam 311 emanates from gain medium 303 in laser cavity 309 and a portion of optical beam 311 having a wavelength substantially equal to the Bragg wavelength of the reflectors 35 and 307 is reflected. Optical beam 311 continues to reflect back and forth between reflectors 305 and 307 such that lasing, or the amplification of stimulated emission of light, occurs in laser cavity 309.

The example laser 301 illustrated in FIG. 3 includes an evanescent coupler 313 disposed in laser cavity 309. In the illustrated example, evanescent coupler 313 is an output coupler having a flat wavelength or spectral response to optical beam 311. As a result, the issues regarding the reduced SMSR in FIG. 1 are addressed. In another example, such as for example a free space laser system, an angled plate could be placed inside the laser cavity and the reflection of light from the angled plate placed inside the laser cavity would provide the laser output. In these described laser output examples, if the optical coupler, such as evanescent coupler 313 or the angled plate in a free space laser system, has a flat wavelength response, the SMSR of the output will be similar to the intra-cavity spectrum. However, a problem with this approach is that an intra-cavity beam tap invariably produces two output beams, which consequently results in the intensity or power of optical beam 311 being split among the multiple outputs.

To illustrate, evanescent coupler 313 of FIG. 3 includes a first optical path, which is illustrated in FIG. 3 as laser cavity 309, and a second optical path, which is illustrated in FIG. 3 as optical waveguide 315. In the illustrated example, laser cavity 309 is evanescently coupled to optical waveguide 317 in evanescent coupler 313. With the evanescent coupling between laser cavity 309 and optical waveguide 315 as shown in the example in FIG. 3, optical beam 311 is evanescently coupled to be directed from laser cavity 309 to optical waveguide 315. In the example of FIG. 3, dashed line 317 shows the plane of symmetry at the center of evanescent coupler 313. In the illustrated example, approximately half of the mode of optical beam 311 is in laser cavity 309 and approximately half of the mode of optical beam 311 is in optical waveguide 315 at the plane of symmetry of evanescent coupler 313.

As shown in the illustrated example, the portion of optical beam 311 propagating from left to right in FIG. 3 is transferred to optical waveguide 315 in evanescent coupler 313, and that a portion of optical beam 311 is ultimately directed out from one end of optical waveguide 315. The portion of optical beam 311 propagating from right to left in FIG. 3 is transferred to optical waveguide 315 in evanescent coupler 313, and that portion of optical beam 311 is ultimately directed out from the opposite end of optical waveguide 315. As a result, evanescent coupler 313 of FIG. 3 has 2 outputs at opposite ends of optical waveguide 315 of evanescent coupler 313. As a consequence, the optical power of optical beam 311 is split between the two outputs, with each output having only about half the intensity or power.

Figure 4:
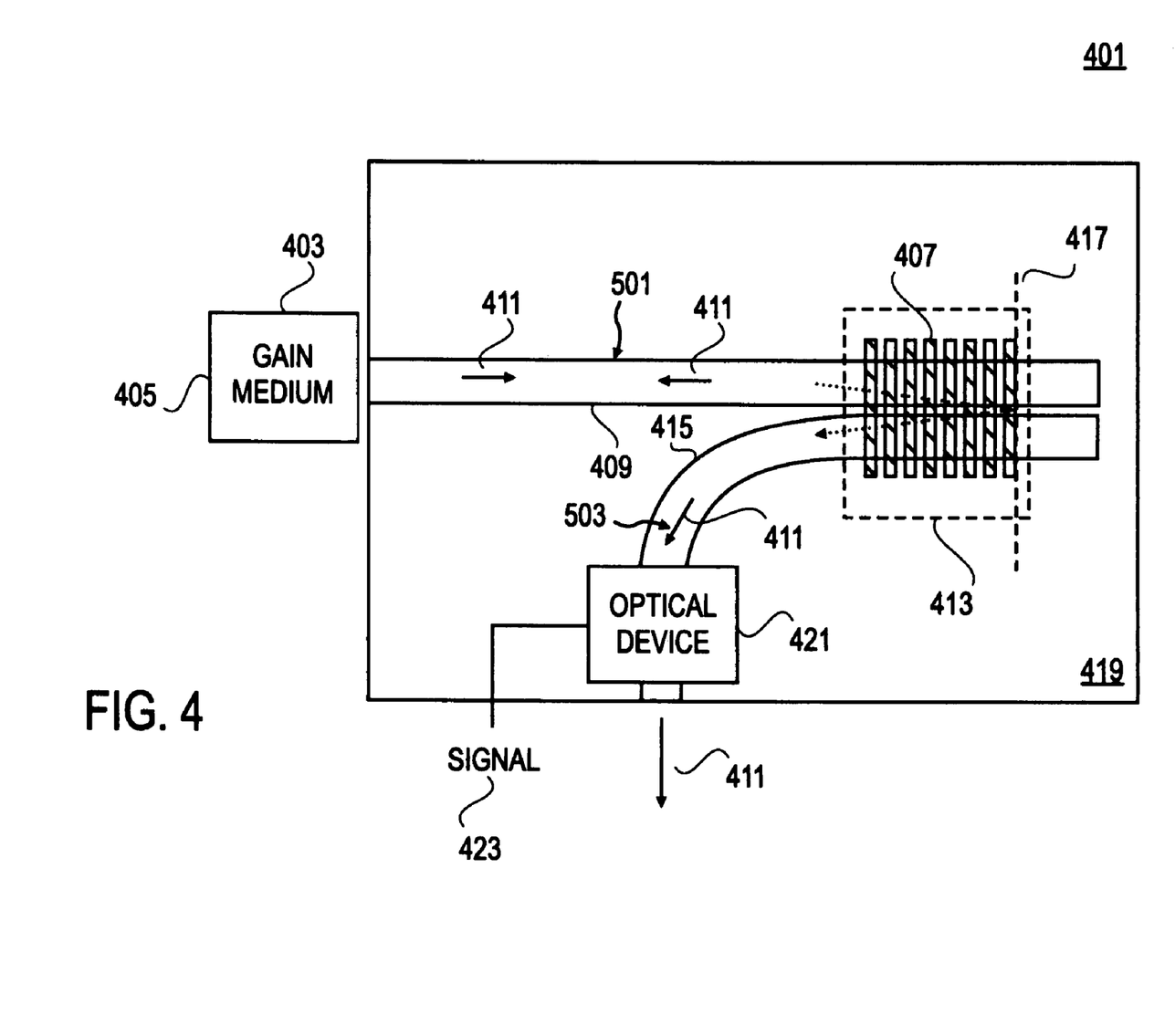
FIG. 4 is a block diagram illustrating one embodiment of a laser having one embodiment of an evanescent output coupler integrated with a reflector in accordance with the teachings of the present invention.

FIG. 4 is a diagram illustrating generally one embodiment of a laser 401 including one embodiment of an evanescent coupler 413 in accordance with the teachings of the present invention. In one embodiment, laser 401 is a ECL laser that includes a gain medium 403 disposed between reflectors 405 and 407. A laser cavity 409 is defined between reflectors 405 and 407. In one embodiment, laser cavity 409 is defined in an optical waveguide that is disposed in semiconductor material 419. In one embodiment, semiconductor material 419 includes silicon and may be included in an epitaxial layer of silicon on a silicon-on-insulator (SOI) wafer. In such an example embodiment, the buried oxide layer of the SOI wafer may serve as cladding to help confine light to remain in laser cavity 409. In other embodiments, it is appreciated that other suitable materials could be employed for laser cavity 409, such as for example but not limited to other semiconductor materials, III–V materials, oxides, an optical fiber made of silica or the like or other suitable optically transmissive materials. In an embodiment in which laser cavity 409 includes an optical fiber, semiconductor material 419 could instead include a suitable material in which the optical fiber of laser 409 could be disposed.

In the illustrated embodiment, it is noted that gain medium 403 is illustrated as being separate from semiconductor material 419. For example, in an embodiment in which semiconductor material 419 includes silicon, gain medium 403 may be employed with a separate gain medium diode that includes for example III–V materials such as for example GaAs, InP, InPGaAs, or other suitable materials. In one embodiment, the wavelength of the light emitted from gain medium 403 is related to the materials used in gain medium 403. For example, in one embodiment using GaAs, gain medium emits light having a wavelength in the range of approximately 800 nm. In another embodiment using InP, gain medium emits light having a wavelength in the range of approximately 1500 nm. In yet another embodiment, a InPGaAs based gain medium could be configured to emit light having a wavelength in the range between approximately 800 nm and approximately 1500 nm. Of course these wavelengths are provide for explanation purposes only and other wavelengths may be utilized in accordance with the teachings of the present invention.

In an example embodiment in which gain medium 403 includes a diode, a cleaved surface may be included in the diode of gain medium 403 to form a facet that may be used as reflector 403, as illustrated for example in FIG. 4. In such an embodiment, the diode of gain medium 403 may be butt-coupled to semiconductor material 419 such that light emitted from gain medium 403 is optically coupled to be received by the optical path included in laser cavity 409.

In another embodiment, gain medium 403 may be included or integrated directly into semiconductor material 419. In such an embodiment, a fully integrated monolithic solution would be provided with gain medium 403 disposed in the laser cavity 409 between reflectors 405 and 407 in accordance with the teachings of the present invention.

In operation, light is emitted from gain medium 403 into laser cavity 409, which is illustrated FIG. 4 as optical beam 411. In the embodiment shown in FIG. 4, reflector 407 is shown as Bragg grating disposed at the end of laser cavity 409. In another embodiment, it is appreciated that reflector 407 could be another suitable type of reflector such as for example but not limited to a cleaved surface forming a reflective facet or the like. In one embodiment, reflector 407 has a Bragg wavelength, which is the wavelength of at least a portion of optical beam 411 that is reflected. Thus, the reflected portion of optical beam 411 has a center wavelength substantially equal to the Bragg wavelength of the reflector 407. Optical beam 411 continues to reflect back and forth between reflectors 405 and 407 such that lasing, or the amplification of stimulated emission of light at the center wavelength, occurs in laser cavity 409.

In one embodiment, reflector 407 is a Bragg grating that includes alternating regions of material disposed in semiconductor material 419 along the optical path of laser cavity 409 such that periodic or quasi-periodic perturbations in the effective index of refraction are provided along the optical path of laser cavity 409. For example, in one embodiment, reflector 407 may include alternating regions having different refractive indexes. A non-exhaustive list of examples include combinations of silicon, polysilicon, silicon-germanium, silicon oxynitride, oxides, or other suitable materials having varying concentrations or the like, all of which result in periodic or quasi-periodic perturbations in the effective index of refraction along laser cavity 409, which define the Bragg grating. In yet another embodiment, the Bragg grating of reflector 407 may be integrated directly into an optical fiber to define the end of laser cavity 409.

As shown in the illustrated embodiment, laser 401 also includes an evanescent output coupler 413 from which optical beam 411 may be output from laser 401 in accordance with the teachings of the present invention. In one embodiment, evanescent output coupler includes reflector 407 integrated with two evanescently coupled optical paths in accordance with the teachings of the present invention. In the embodiment illustrated in FIG. 4, the two evanescently coupled optical paths of evanescent output coupler 413 include the optical path of laser cavity 409 and another optical path, which is shown as optical waveguide 415 disposed in semiconductor material 419. In one embodiment, optical waveguide 415 is the output of evanescent coupler 413. In another embodiment, optical waveguide 415 could instead be an optical fiber evanescently coupled to laser cavity 409 and integrated with reflector 407 in evanescent output coupler 413.

As shown in the depicted embodiment, reflector 407 is defined in evanescent output coupler 413 at the plane of symmetry 417 in the evanescent output coupler 413. In one embodiment, the alternating regions of material disposed in semiconductor material 419 of the Bragg grating of reflector 407 extend across both the laser cavity 409 and the optical waveguide 415 in the evanescent coupling of evanescent coupler 413 such that the Bragg grating is integrated with both of the optical paths of evanescent coupler 413. As optical beam 411 propagates along laser cavity 409 from left to right in FIG. 4, the mode of optical beam 411 begins to be transferred from laser cavity 409 to optical waveguide 415 through the evanescent coupling in evanescent output coupler 413. By the time optical beam 411 reaches the plane of symmetry 417 in the evanescent output coupler 413, approximately half of the mode of optical beam 411 is transferred from laser cavity 409 to optical waveguide 415. However, with reflector 407 defined at the plane of symmetry 417 in the evanescent output coupler 413, the remaining half of the mode of optical beam is evanescently coupled or transferred from laser cavity 409 to optical waveguide 415 as optical beam 411 is reflected from reflector 407 in accordance with the teachings of the present invention.

With reflector 407 integrated with the optical path of laser cavity 409 and the optical path of optical waveguide 415 as described, optical beam 411 is reflected while in the same time and space is simultaneously or concurrently evanescently coupled from laser cavity 409 to optical waveguide 415 within evanescent coupler 413 in accordance with the teachings of the present invention. With reflector 407 defined at the plane of symmetry 417 at the center of the evanescent output coupler 413, evanescent output coupler 413 is, in effect, folded in half in accordance with the teachings of the present invention. With evanescent output coupler 413 folded in half as described in the illustrated embodiment, the reflecting of optical beam 411 occurs in conjunction with the evanescent coupling of optical beam 411 from laser cavity 409 to optical waveguide 415 in accordance with the teachings of the present invention. In addition, there is only one output for optical beam 411 from laser cavity 409 through optical waveguide 415 in accordance with the teachings of the present invention.

Therefore, the output of optical beam 411 from evanescent coupler 413 is not split among multiple outputs and is not transmitted through a Bragg grating, which has a transmission function that reflects or blocks a portion of the output optical beam. As a result, optical beam 411 is output from evanescent output coupler 413 having an output spectrum 503, which has substantially more intensity or power for optical beam 411 than the output spectrum of previously described lasers in accordance with the teachings of the present invention.

Figure 5A:
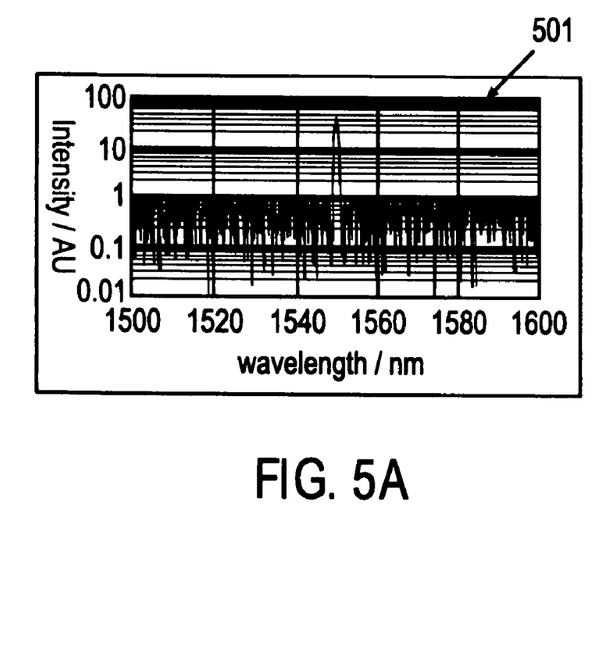
FIG. 5A is a diagram illustrating one embodiment of the intra-cavity spectrum of an optical beam within a laser cavity in accordance with the teachings of the present invention.
Figure 5B:
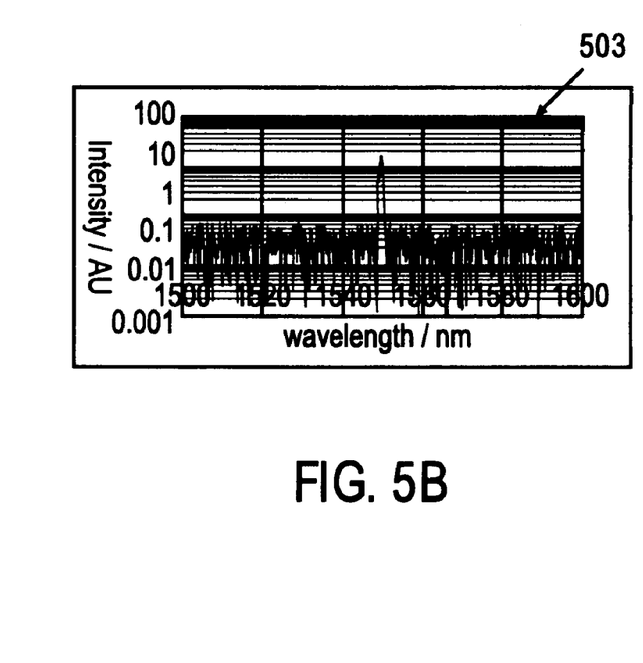
FIG. 5B is a diagram illustrating one embodiment of the resulting output spectrum of an optical beam transmitted from an output of one embodiment of an evanescent output coupler integrated with a reflector included in a laser in accordance with the teachings of the present invention.

To illustrate, FIG. 5A shows one example of the intra-cavity spectrum 501 of optical beam 411 within laser cavity 409 and FIG. 5B shows one example of the output spectrum 503 of optical beam 411 from optical waveguide 415 from evanescent coupler 413 in accordance with the teachings of the present invention. As shown in the intra-cavity spectrum 501 depicted in FIG. 5A, lasing of optical beam 411 occurs at approximately 1550 nm. As shown in FIG. 5B, the output spectrum 503 of optical beam 411 from optical waveguide 415 has substantially more intensity of power than output spectrum 205 described above or the output spectrum of optical beam 311, which is split among multiple outputs. It is appreciated that these wavelengths are provided for explanation purposes only and that optical beam 411 may have a different wavelength in accordance with the teachings of the present invention.

Referring back the embodiment depicted in FIG. 4, an optical device 421 is optionally included in semiconductor material 419 in one embodiment of the present invention. In one embodiment, optical device 421 is optically coupled to receive optical beam 411 through optical waveguide 415. In one embodiment, optical device 421 may include a photonic device monolithically integrated into semiconductor material 419. In one embodiment, optical device 421 is coupled to receive a signal 423. In one embodiment, optical device 421 may include one or more optical phase shifters, one or more optical modulators, one or more optical switches or other known suitable device(s) or future arising technology that can operate on optical beam 411. For example, in one embodiment optical device 421 is an optical modulator that is adapted to modulate optical beam 411 in response to signal 423. In another embodiment, optical device 421 is not included in semiconductor material and is instead disposed in a separate chip that is optically coupled to receive optical beam 411.

Figure 6:
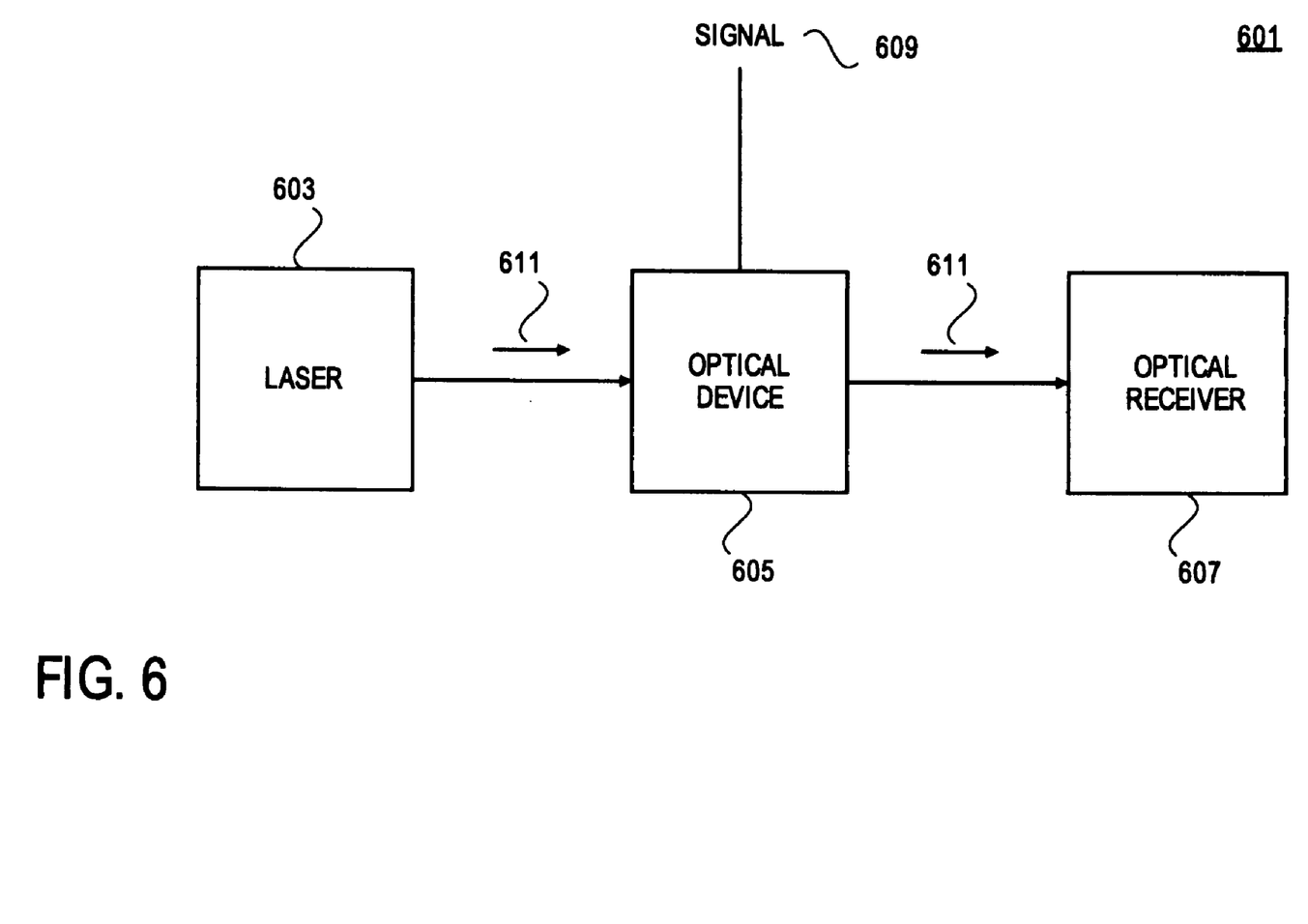
FIG. 6 is a block diagram illustration of one embodiment of a system including an optical transmitter, an optical receiver and an optical device according to embodiments of the present invention.

FIG. 6 illustrates generally a block diagram of one embodiment of a system including an optical transmitter and an optical receiver with an optical device according to embodiments of the present invention. In particular, FIG. 6 shows optical system 601 including an optical transmitter, which is shown as laser 603 emitting an optical beam 611, which is received by an optical receiver 607. In one embodiment, laser 603 is similar to laser 401. In one embodiment, optical system 601 also includes an optical device 605 optically coupled between laser 503 and optical receiver 607. In one embodiment, optical device 605 may replace optical device 421 of FIG. 4. In another embodiment, optical device 421 is used instead of optical device 605. In yet another embodiment, both optical device 605 and optical device 421 are included. In still another embodiment, neither optical device 605 nor optical device 421 are included.

Referring back to the illustrated embodiment, laser 603 is adapted to emit optical beam 611, which is received by optical device 605. In one embodiment, optical device 605 is adapted to modulate optical beam 611 in response to signal 609. In another embodiment, optical device 605 is adapted to phase shift optical beam 611 in response to signal 609. In such an embodiment, optical device 605 serves as an optical delay responsive to signal 609. As shown in the illustrated embodiment, optical beam 611 is then directed to optical receiver 607. In various embodiments according to the teachings of the present invention, it is appreciated that embodiments of the disclosed optical devices can be used in a variety of high bandwidth applications including multiprocessor, telecommunications, networking as well as other high speed optical applications such as optical delay lines, switches, modulators, add/drops, or the like.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A system, comprising:
a laser having a laser cavity including a gain medium defined between first and second reflectors and an evanescent output coupler optically coupled to the laser cavity, the evanescent output coupler including the second reflector integrated with the laser cavity and an output of the evanescent coupler such that an optical beam in the laser cavity is reflected from the second reflector as the optical beam is concurrently evanescently coupled to the output of the evanescent coupler; and
an optical receiver optically coupled to receive the optical beam from the output of the evanescent coupler, the optical beam having an output spectrum that is similar to an intra-cavity spectrum of the optical beam directed through the laser cavity.

2. The system of claim 1 wherein the second reflector comprises a Bragg grating.

3. The system of claim 1 wherein the second reflector is defined at a plane of symmetry in a center of the evanescent coupler.

4. The system of claim 1 wherein the evanescent coupler including the second reflector are disposed in semiconductor material.

5. The system of claim 4 further comprising an optical device optically coupled between the output of the evanescent coupler and the optical receiver.

6. The system of claim 5 wherein the optical device is disposed in the semiconductor material.

7. The system of claim 4 wherein the optical device comprises an optical modulator adapted to modulate the optical beam in response to a signal.

8. The system of claim 4 wherein the semiconductor material comprises silicon.

9. The system of claim 1 wherein the laser comprises an external cavity laser (ECL).

* * * * *